(12) United States Patent
Liu et al.

(10) Patent No.: US 10,679,696 B2
(45) Date of Patent: Jun. 9, 2020

(54) CROSS-POINT MEMORY COMPENSATION

(71) Applicant: Micron Technology, Inc., Boise, ID (US)

(72) Inventors: Zengtao T. Liu, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 15/620,415

(22) Filed: Jun. 12, 2017

(65) Prior Publication Data

US 2017/0278568 A1 Sep. 28, 2017

Related U.S. Application Data

(62) Division of application No. 14/739,798, filed on Jun. 15, 2015, now Pat. No. 9,679,642, which is a division of application No. 13/269,717, filed on Oct. 10, 2011, now Pat. No. 9,058,857.

(51) Int. Cl.
*G11C 13/00* (2006.01)
*G11C 8/08* (2006.01)

(52) U.S. Cl.
CPC ............ *G11C 13/004* (2013.01); *G11C 8/08* (2013.01); *G11C 13/003* (2013.01); *G11C 13/0026* (2013.01); *G11C 13/0028* (2013.01); *G11C 13/0033* (2013.01); *G11C 13/0038* (2013.01); *G11C 2013/0054* (2013.01); *G11C 2013/0057* (2013.01); *G11C 2013/0083* (2013.01); *G11C 2213/77* (2013.01)

(58) Field of Classification Search
None
See application file for complete search history.

(56) References Cited

U.S. PATENT DOCUMENTS

| | | | |
|---|---|---|---|
| 6,076,136 A * | 6/2000 | Burroughs | G06F 12/04 365/230.03 |
| 6,597,600 B2 | 7/2003 | Baker | |
| 6,804,153 B2 | 10/2004 | Yoshizawa et al. | |
| 7,113,422 B2 | 9/2006 | Theel | |
| 7,495,955 B2 | 2/2009 | Ido | |
| 7,688,614 B2 | 3/2010 | Morimoto | |
| 7,969,768 B2 | 6/2011 | Takizawa et al. | |
| 8,139,409 B2 | 3/2012 | Chevallier et al. | |
| 9,058,857 B2 | 6/2015 | Liu et al. | |
| 9,679,642 B2 | 6/2017 | Liu et al. | |
| 2010/0321978 A1 | 12/2010 | Inoue | |

(Continued)

FOREIGN PATENT DOCUMENTS

| | | | |
|---|---|---|---|
| JP | 2008257789 A | 10/2008 | |
| WO | WO-2009075130 A1 * | 6/2009 | ......... G11C 13/0004 |

*Primary Examiner* — Richard Elms
*Assistant Examiner* — R Lance Reidlinger
(74) *Attorney, Agent, or Firm* — Schwegman Lundberg & Woessner, P.A.

(57) ABSTRACT

The apparatuses and methods described herein may operate to measure a voltage difference between a selected access line and a selected sense line associated with a selected cell of a plurality of memory cells of a memory array. The voltage difference may be compared with a reference voltage specified for a memory operation. A selection voltage(s) applied to the selected cell for the memory operation may be adjusted responsive to the comparison, such as to dynamically compensate for parasitic voltage drop.

12 Claims, 6 Drawing Sheets

(56) References Cited

U.S. PATENT DOCUMENTS

| | | |
|---|---|---|
| 2011/0122684 A1 | 5/2011 | Sheu et al. |
| 2011/0188289 A1* | 8/2011 | Chevallier .............. G11C 11/21 365/148 |
| 2013/0088909 A1 | 4/2013 | Liu et al. |
| 2015/0279460 A1 | 10/2015 | Liu et al. |

* cited by examiner

CROSS-POINT MEMORY COMPENSATION

PRIORITY APPLICATION

This application is a divisional of U.S. application Ser. No. 14/739,798, filed Jun. 15, 2015, now issued as U.S. Pat. No. 9,679,642, which is a divisional of U.S. application Ser. No. 13/269,717, filed Oct. 10, 2011, now issued as U.S. Pat. No. 9,058,857, all of which are incorporated herein by reference in their entireties.

BACKGROUND INFORMATION

Continuously reducing the size of solid-state memory architecture is an effective way to increase the capacity of such memories for a given amount of circuit real estate. However, the resulting feature size can give rise to design and process challenges. One of these challenges relates to an unwanted parasitic voltage drop that occurs at the location of a selected cell. In particular, when a selection voltage(s) (e.g., Vsel or 0 V) for an associated memory operation is applied from one or more relevant drivers to a corresponding one of a selected access line (e.g., WL) and a selected sense line (e.g., BL) associated with the selected cell, the actual voltage across the selected cell (e.g., Vcell) may become lower than difference between the applied selection voltage(s) (Vsel–0 V=Vsel). Such an unwanted voltage (IR: current*resistance) drop at the selected cell may occur due to parasitic current leakage. Sometimes, the voltage drop caused by the parasitic current leakage may corrupt the outcome of a memory operation.

BRIEF DESCRIPTION OF THE DRAWINGS

FUG. 1 shows a schematic diagram illustrating a parasitic voltage (IR) drop, with compensation, in a cross-point resistive random access memory (RRAM) array, according to various embodiments of the invention.

DETAILED DESCRIPTION

Various embodiments described herein may operate to compensate for a parasitic voltage (IR) drop in a memory array. In various embodiments, for example, an IR compensation scheme through Kelvin contact resistance measurement is disclosed for set, reset and read operations in a cross-point resistive random access memory (RRAM) array. That is, when a selection voltage(s) (e.g., Vsel) is applied to a selected cell, by measuring the voltage difference along a selected access line (WL) and a selected sense line (BL) associated with the selected cell at the opposite end of associated WL/BL drivers, a feedback mechanism can be implemented to dynamically adjust the selection voltage(s) (e.g., Vsel), such as to compensate for the parasitic IR drop along the selected WL/BL, such as according to Kelvin contact resistance principles. Then, a memory operation directed to the selected cell may be executed or complete execution responsive to the adjusted selection voltage(s) being applied to the selected cell, perhaps improving the overall reliability of array operation.

Figure 1:
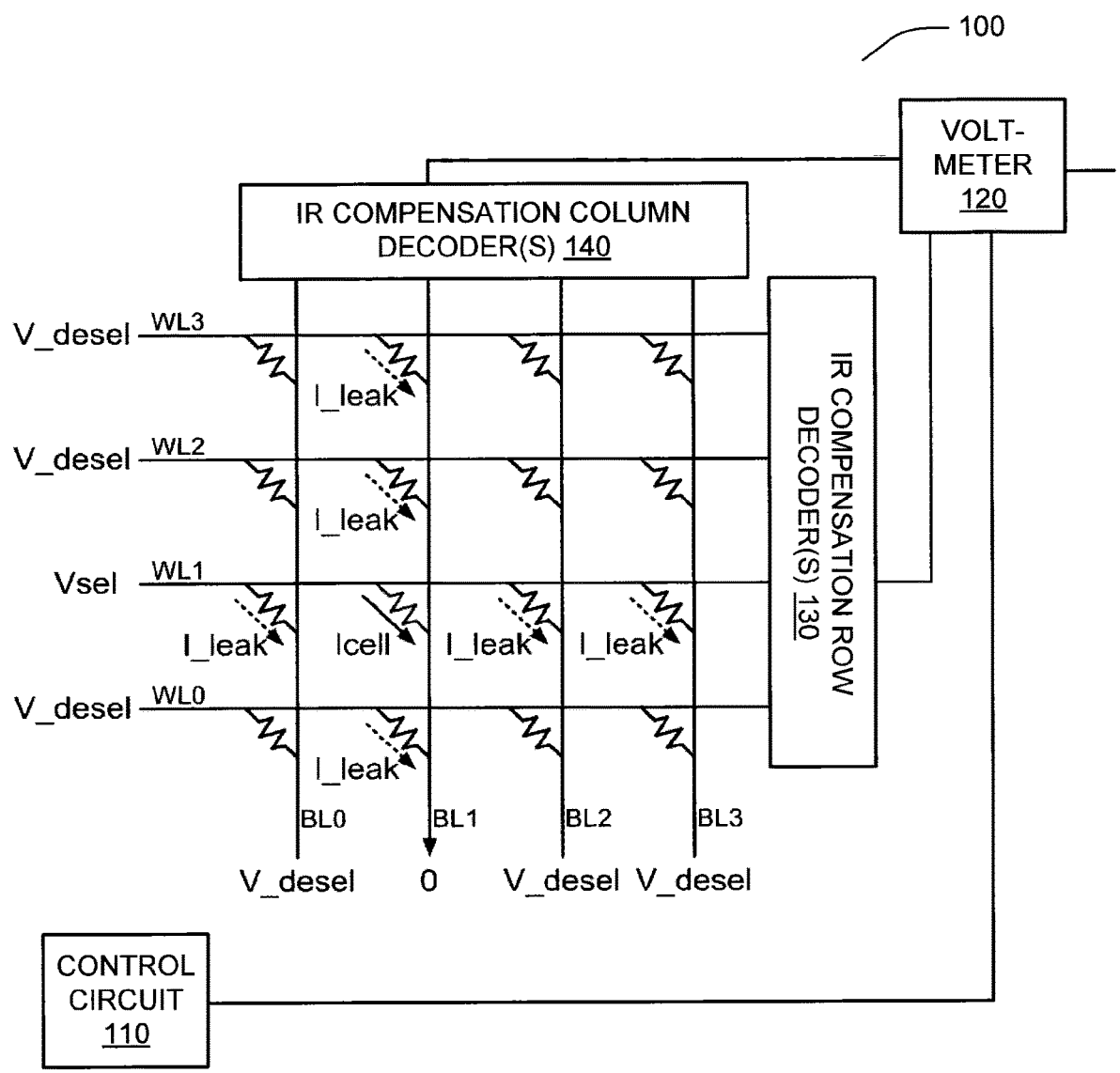

FIG. 1 shows a schematic diagram illustrating a parasitic voltage (IR) drop, with compensation, in a cross-point RRAM array 100, according to various embodiments of the invention. The cross-point RRAM array 100 may comprise a set of access lines (WL0-WL3) running in a first direction in one layer of metal and a set of sense lines (BL0-BL3) running in a second direction substantially perpendicular to the first direction in another layer of metal. A memory cell may be formed at each cross-point between a corresponding access line and sense line. The memory cell may comprise one or more tunable resistive materials, such as phase change chalcogenides (e.g., $Ge_2Sh_2Te_5$ or AgInSbTe), binary transition metal oxides (e.g., NiO or $TiO_2$), perovskites (e.g., $Sr(Zr)TiO_3$ or PCMO), solid-state electrolytes (e.g., GeS, GeSe, or $Cu_2S$), organic charge transfer complexes (e.g., CuTCNQ), organic donor-acceptor systems (e.g., Al AIDCN) and various molecular systems.

In various embodiments, the state of each memory cell may be manipulated by applying an appropriate voltage across the memory cell. For example, for a set operation, a relatively high positive voltage (e.g., about 3.0 volt) may be applied across a selected cell such that the resistive material of the memory cell enters into a first resistant state (e.g., low resistant state). For a reset operation, the polarity of the positive voltage may be reversed such that the resistive material enters into a second resistant state (e.g., high resistance state). For a read operation, a relatively low voltage (e.g., about 0.5 volts) may be applied across a selected cell to read out the resistant state of the resistive material of the memory cell.

The RRAM array 100 may be coupled with a dynamic IR compensator, such as one comprising a control circuit, a volt-meter, an IR compensation row decoder and an IR compensation column decoder, as shown in symbolic form 110, 120, 130 and 140, respectively. Operation of the dynamic IR compensator of the RRAM array 100 will be described in detail below.

For example, referring now to FIG. 1, when a selection voltage ("Vsel") is applied to the access line ("WL 1") and a selection voltage (e.g., 0 V) is applied to the sense line ("BL 1"), parasitic current leakages ("I-leaks") along the WL1 and BL1 cause the actual voltage across the selected cell to be lower than the difference between the applied selection voltages (i.e., Vsel, since Vsel–0V=Vsel). Conventionally, the access lines (WL0-WL3) and sense lines (BL0-BL3) of the cross-point memory array 100 may be made of metals, such as Cu or W, with fine feature size (e.g. 20-30 nm), thus having a finite resistance. The resistance of each line can be determined by $R=rho*L/(W*T)$, where R is the resistance of the line, rho is the resistivity of the material, and L, W, T are the length, width, and thickness of the line, respectively.

For an array with a reasonable size, there may be a few thousand memory cells along each access line (WL) and sense line (BL). In such a case, the memory cell at the far end of the selected WL, away from a corresponding driver will see a full parasitic voltage (IR) drop along the selected WL, and the memory cell at the far end of the selected BL, away from a corresponding driver, will see a full parasitic voltage drop (IR) along the selected BL. In each case, the voltage drop depends on the respective line resistance as well as the current. For example, at 10-30 nm feature size, the line resistance can easily measure a few kilo-ohms. If 100 µA current is needed to switch the state of the memory cells, the parasitic voltage drop might amount to a few hundred mV, which may be non-negligible, because a variation of that magnitude can significantly change the switching characteristics of the memory cells of the RRAM array 100.

When the line resistance is non-negligible, the actual voltage across the selected cell, at the cross-point of the selected WL and BL, ("Vcell") can be significantly different from the difference between the applied selection voltages (e.g., Vsel, in the case where Vsel and 0V are the two applied voltages). Additionally, the difference between Vcell and Vsel, for example, can vary depending on the location (which might correspond to a physical address) of the selected cell within the memory array. Without IR compensation, Vcell variation can lead to significant variations in cell set/reset characteristics and the degradation of sense margin during read. For example, if left uncompensated, the memory cells at the near end (close to drivers applying the selection voltages) of the WL/BL will be set/reset at a different voltage from the memory cells at the far end (away from the drivers) of the WL/BL, resulting in more variations and less reliability of the RRAM array 100.

Under conventional IR compensation schemes, the selection voltage(s) (e.g., Vsel) being applied to an access line coupled to a given selected cell is preadjusted based on the address of the selected cell and anticipated current leakage (previously known through cell characterization). However, under such static IR compensation schemes, if the current leakage for the unselected cells along the selected WL/BL is significant and/or dependent on the background data patterns stored on the unselected cells, effective compensation cannot be achieved because the data pattern of the unselected cells is generally not known to the system prior to the operation. Compensation scheme based on one background data pattern (e.g. worst case or random data) can lead to significant over or under compensation for a different background data pattern. This in turn results in less efficiency and/or increased complexity in the design of an apparatus in the form of a memory device, such as one including the RRAM array 100.

A dynamic IR compensation scheme may be implemented using the volt-meter 120 to measure a voltage difference between the selected WL and the selected BL at the far end, away from their respective drivers. In various embodiments, the volt-meter 120 may be configured to provide high impedance sufficient not to draw appreciable current from the selected WL or the selected BL. In one embodiment, for example, the Most straightforward implementation may be to route the signal directly to the gate of a small transistor, which should have near infinite DC impedance and high AC impedance due to small gate capacitance.

In various embodiments, an extra set of IR compensation row 130 and/or IR compensation column decoders 140 may be employed to selectively couple the selected WL and/or the selected BL to the volt-meter 120, such as to measure the voltage difference between the selected WL and the selected BL at an end opposite of the one or more drivers, such as before completion of a memory operation directed to the selected cell. As will be explained in detail with respect to FIG. 2, the IR compensation row decoder 130 and/or IR compensation column decoder 140 may be employed in addition to a set of regular row and column decoders that selectively couple the selected access line (WL) and the selected sense line (BL) to a corresponding driver(s).

In one embodiment, the extra set of IR compensation row/column decoders 130, 140 may be solely used for the IR compensation. In such a case, the transistors in the extra set of IR compensation row and column decoders 130, 140 may be minimum-sized because there is no substantial current requirement. Minimum-sized may refer to the smallest transistors the technology platform allows according to the design rules in place for a given feature size. There is no appreciable current requirement because the IR compensation row and column decoders 130, 140 may be used only to couple the selected WL and the selected BL to the volt-meter 120 and do not need to supply substantial current to the selected WL or selected BL. As noted above, the high-impedance nature of the volt-meter 120 can allow minimizing this current requirement for the IR compensation row and column decoders 130, 140.

The positions of the IR compensation row and column decoders 130, 140 may depend on those of the regular decoders. In one embodiment, if the regular decoders are placed on one side of the access lines (WLs) and sense lines (BLs), the IR compensation row and column decoders 130, 140 may be placed on the opposite side of the WLs and BLs. In yet another embodiment, if the regular row and column decoders are on both sides of the WLs and BLs (e.g. the odd-numbered WLs driven from the left side while the even-numbered WLs driven from the right side, and vice versa), the IR compensation row and column decoders 130, 140 may be placed on both sides of the WLs and BLs. In such a scenario, each of the IR compensation row and column decoders 130, 140 may be formed outside a corresponding one of the regular row and column decoders, and arranged in such a way that the activated IR compensation row or column decoder is always on the opposite end of the activated regular row or column decoder.

Once the voltage difference between the selected WL and the selected BL at the end opposite of the driver(s) is measured, the measured voltage (e.g., Vmeas) may be compared with a reference voltage (e.g., Vref) specified for an associated memory operation. Then, based on the comparison result, at least one of the selection voltages (e.g., Vsel) may be adjusted to produce an adjusted voltage (e.g., Vadj). Then, by applying the adjusted voltage (Vadj) to execute or complete execution of the memory operation, the IR compensation scheme according to various embodiments can compensate for the parasitic IR drop along the selected WL and/or the selected BL.

In various embodiments, the reference voltage may be a known quantity through cell parametric characterization. It may be the voltage that is chosen by a memory device designer to apply to any selected cell for a given operation, such as set, reset, or read, in order to provide the best trade-off between memory window, speed, power consumption, disturb, endurance, etc. Accordingly, in at least one embodiment, the reference voltage is not an address-dependent quantity. In one embodiment, the reference voltage may be stored in and retrieved from a register, and may be trimmed to account for process variations.

As noted above, such an IR compensation scheme may be implemented with any of the cell operations, such as set, reset and read. In various embodiments, the measurement of Vmeas may be performed for every set/reset/read operation, and may be controlled by control circuitry (logic circuits in the periphery of a memory array), such as the control circuit 110. In one embodiment, for the read operation, measuring Vmeas may be sufficiently fast to adjust the selection voltage(s) for the read operation before activating associated sense amplifiers.

In one embodiment, for the set/reset operations, it may be more flexible to apply multiple pulses of a selection voltage(s) to accurately place the selected cell into the desired memory state, with a verification pulse (read operation) in between. For example, if the set/reset pulses are relatively long (e.g., >~1 μs), the selection voltage(s) may be substantially instantaneously adjusted within each set/reset pulse. On the other hand, if the set/reset pulses are relatively short (e.g., <~100 ns), such that it is not possible to implement a useful amount of feedback, the measurement result of the previous pulse may be used to adjust the magnitude of the next set/reset pulse. In this case, the compensation may be implemented after the first pulse.

In various embodiments, the control circuit 110 may be configured to implement the IR compensation scheme only for the memory cells located sufficiently far away from the associated drivers. For example, in one embodiment, the control circuit 110 may be configured to refrain from implementing the IR compensation scheme with the memory cells located within one third (⅓) or a half (½) of the WL/BL in radius from the associated WL/BL driver(s).

The IR compensation scheme may work more effectively for the memory cells far away from the WL/BL driver(s), where the need is the greatest, since the actual voltage across the selected cell (Vcell) depends on the location of the selected cell—the farther it is away from the associated WL/BL driver, the worse the parasitic IR drop will likely be. Also, due to, for example, sneak path leakages along the selected access line (WL) and the selected sense line (BL), the parasitic voltage drops along the selected WL and the selected BL, and in turn the Vcell, may be affected by the background data pattern at each cell along the selected WL and the selected BL as well.

Thus, a variety of embodiments described herein comprise apparatuses and methods for dynamically compensating for a parasitic voltage (IR) drop along a selected WL and/or a selected BL using Kelvin contact resistance measurement. In the following description, the examples have specific details that are set forth to provide an understanding of the illustrated embodiments. It will be evident, however, to one of ordinary skill in the art, after reading this disclosure, that these examples may be practiced without some of the example-specific details, and/or with different combinations of the details than are given here. Thus, these embodiments are given for the purpose of simplified explanation, and not limitation. Some example embodiments that incorporate these mechanisms will now be described in more detail with respect to FIGS. 2-5.

Figure 2:
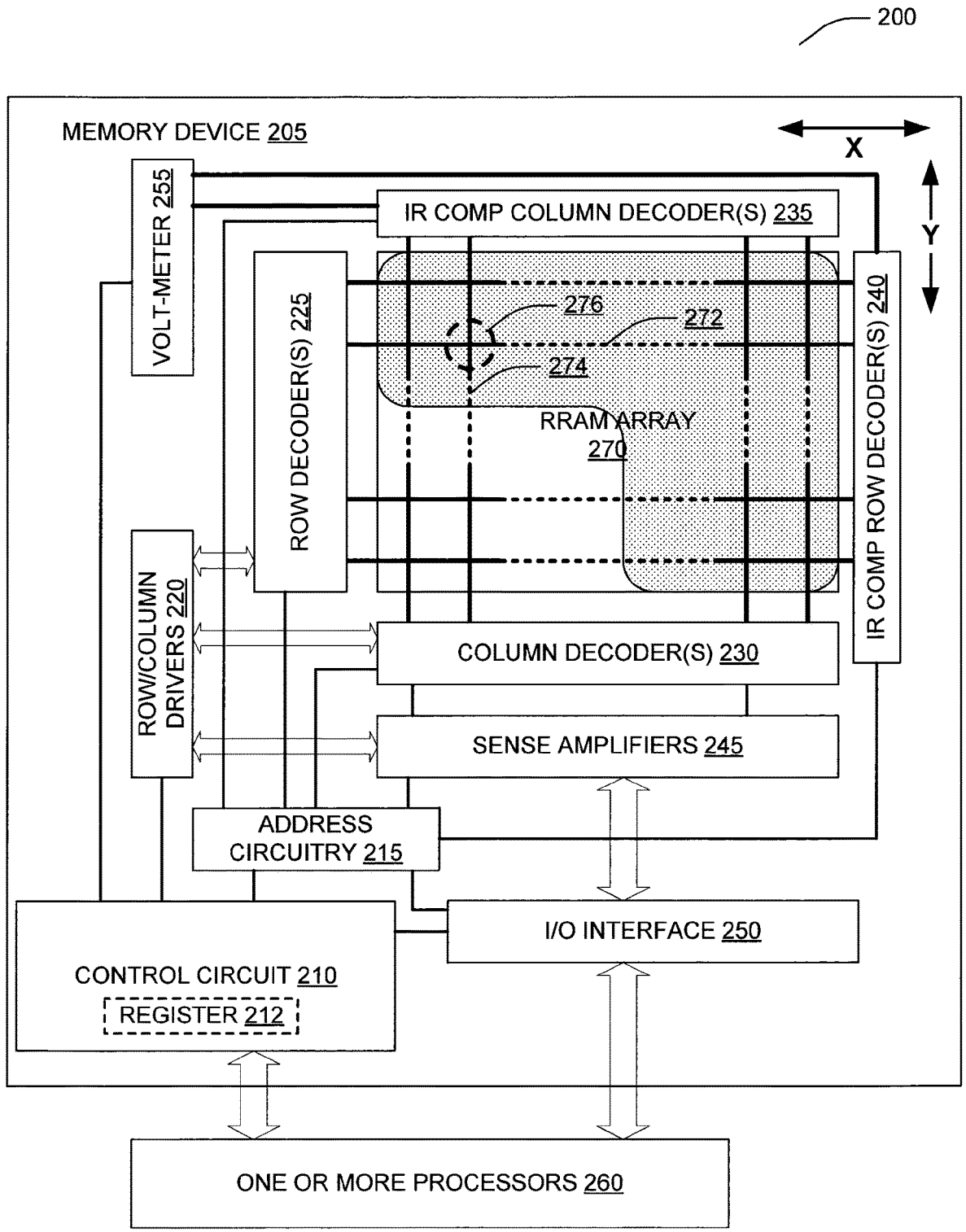
FIG. 2 shows a block diagram of a memory device to compensate for a parasitic voltage (IR) drop in a memory array therein, according to various embodiments of the invention.

FIG. 2 is a block diagram of an apparatus in the form of a system 200 to compensate for a parasitic voltage (IR) drop in a memory array, according to various embodiments of the invention. The system 200 may comprise one or more processors 260 to issue memory commands, and a memory device 205 to receive the memory commands from the one or more processors 260. The memory device 205 may comprise a control circuit 210, address circuitry 215, a row/column driver 220, a row decoder 225, a column decoder 230, a sense amplifier 245, an input/output (I/O) interface 250, and a memory array 270. In one embodiment, the memory array 270 may comprise the RRAM array 100 of FIG. 1. It is noted that although the components in the memory device 205 are explained in the singular form for simplicity, each of them may be implemented in more than one entity and yet provide the same functionalities.

Referring now to FIG. 2, the I/O interface 250 may be configured to exchange information between one or more components in the memory device 205 and the one or more processors 260. For example, the I/O interface 250 may receive a command to perform a read, set or reset memory operation from the one or more processors 260, and then transfer the received command to the control circuit 210. The I/O interface 250 may also receive memory address information that may be used to select a memory cell(s) upon which to perform the memory operation.

The control circuit 210 may control memory operations of memory device 205 based on the received command and/or control signals (detail not shown in FIG. 2). Examples of the control signals may comprise one or more clock signals and other signals to indicate which operation (e.g., read, set, or reset operation) memory device 100 is to perform. The control circuit 210 may also control a compensation scheme for a parasitic voltage (IR) drop that may occur in the memory array 270. Operations of the control circuit 210 will be described in detail below.

The address circuitry 215 may operate to select a memory cell(s) 276 from the memory array 270 that is associated with received memory address information, such as by using the row decoder 225 and the column decoder 230. For example, the row decoder 225 may select an access line (WL) 272 from a plurality of access lines, and couple the selected access line (WL) 272 to the row/column driver 220. Similarly, the column decoder 230 may select a sense line (BL) 274 from a plurality of sense lines, and couple the selected sense line (BL) 274 to the row/column driver 220. The address circuitry 215 may also selectively couple the selected cell(s) 276 to the sense amplifiers 245 using the selected access line (WL) 272 and/or the selected sense line (BL) 274 to complete execution of the memory operation directed to the selected cell.

The row/column driver 220 may apply selection voltages, such as "Vsel" and "0 V" of FIG. 1, to the selected access line and the selected sense line, respectively. The row/column driver 220 may also apply de-selection voltages, such as "V_desel" of FIG. 1, to other access lines and/or sense lines that are not selected. It is noted that in various embodiments, the row/column driver 220 may also be implemented as two or more separate entities each dedicated to either the access lines or the sense lines.

If the memory operation is a read operation, the sense amplifiers 245 may determine the value of information from the selected cell(s) 276 and provide the information to the I/O interface 250 in the form of signals via a relevant data channel (e.g., the arrow between 245 and 250). If the memory operation is a set operation, the sense amplifiers 245 may determine the value of information to be written (e.g., programmed) into the selected memory cell 276 from the signals on the data channel received from the I/O interface 250.

In various embodiments, the control circuit 210 may operate to monitor whether a selection voltage(s) for a memory operation is being applied to a selected one of the memory cells of the memory array 270. The control circuit 210 may operate to measure a voltage difference between the selected access line 272 and the selected sense line 274, Vmeas, at an opposite end from the drivers 220, such as based on a determination that a selection voltage(s) (e.g., Vsel) is being applied to the selected cell 276. The control circuit 210 may compare the voltage Vmeas with a reference voltage (Vref) specified for the memory operation type. In one embodiment, a voltage drop across the selected access line 272 and/or the selected sense line 274 may be computed. The control circuit 210 may then adjust at least one of the selection voltages (e.g., Vsel) responsive to (e.g., using the outcome of) the comparison, such as to dynamically compensate for the parasitic voltage drop(s) along the selected access line 272 and/or the selected sense line 274.

In one embodiment, the control circuit 210 may comprise a register 212 to store a value of the reference voltage, as illustrated at FIG. 2.

In various embodiments, the control circuit 210 may hold activating the sense amplifier 245 until measuring the voltage difference across the selected cell, comparing the measured voltage with the reference voltage, such as to compute the voltage drop along the selected access line 272 and the selected sense line 274, and adjusting the selection voltage(s) are completed. When the adjusted selection voltage(s) is applied to the selected cell and it is determined that the new measured voltage is at least substantially equal to (e.g., at least about 90% of or greater than) the reference voltage, the control circuit 210 may activate the sense amplifier 245 to complete the memory operation at the selected cell. If the new measured voltage is determined to be substantially less than (e.g., no more than about 90%) the reference voltage, then the control circuit 210 may keep holding activating the sense amplifier 245 and readjust the adjusted selection voltage(s).

In various embodiments, still referring to FIG. 2, the memory device 205 may further comprise a volt-meter 255. The volt-meter 255 may be coupled to, and controlled by, the control circuit 210, such as to measure the voltage difference between the selected access line and the selected sense line. In one embodiment, the volt-meter 255 may be configured to provide impedance of two, three, or more orders of magnitude higher than the collective impedance of the access lines and sense lines including the selected access line 272 and the selected sense line 274. That is, depending on the resistance of the memory cells of the memory array 270, the impedance of the volt-meter 255 may vary. For example, if the memory cells are relatively low resistance cells whose operating resistance ranges between about 10K ohms and about 1M ohms, then the volt-meter 255 may be configured to provide an impedance of about 100M ohms. For another example, if the memory cells are operated at 10M ohms, then the volt-meter 255 may be configured to provide an impedance of about 1G ohms.

In various embodiments, in addition to the row decoder 225 and the column decoder 230 that selectively couple the selected access line 272 and the selected sense line 274 to the row/column driver 220, the memory device 205 may further comprise an IR compensation row decoder 240 and/or an IR compensation column decoder 235. The IR compensation row decoder 240 and the IR compensation column decoder 235 may selectively couple the selected access line 272 and the selected sense line 274 to the volt-meter 255, respectively.

In various embodiments, the row decoder 225 may be formed at one end of a plurality of access lines including the selected access line 272 and the IR compensation row decoder 240 may be formed at the opposite end of the plurality of access lines, facing the row decoder 225. Similarly, in various embodiments, the column decoder 230 may be formed at one end of a plurality of sense lines including the selected sense line 274, and the IR compensation column decoder 235 may be formed at the opposite end of the plurality of sense lines, facing the column decoder 230.

Now referring back to FIG. 2, in various embodiments, the control circuit 210 may be further configured to refrain from implementing IR compensation, including measuring the voltage difference between the selected access line and the selected sense line, based on a determination that the selected cell is located in a specified area of the memory array 270, such as the non-shaded area of the memory array 270 in FIG. 2. In one embodiment, the control unit 210 may be configured to determine that the selected cell is located in the specified area based on a determination that the selected cell is closer to a corresponding driver supplying the selection voltage(s), such as the row/column driver 220, than a threshold distance. For example, the threshold distance may be about one-quarter (¼), one-third (⅓) or one-half (½) of the length of the access and/or sense lines.

In various embodiments, the memory device 205 may further comprise a plurality of IR compensation row decoders 240 including a first compensation row decoder and a second compensation row decoder (not shown in FIG. 2). In one embodiment, the control circuit 210 may be configured to use the first compensation row decoder or the second compensation row decoder to selectively couple the selected access line (WL) 272 to the volt-meter 255 based on a determination that the selected access line 272 is an odd-numbered access line or an even-numbered access line, respectively.

In various embodiments, the memory device 205 may further comprise a plurality of IR compensation column decoders 235 including a first compensation column decoder and a second compensation column decoder (detail not shown in FIG. 2). In one embodiment, the control circuit 210 may be configured to use the first compensation column decoder or the second compensation column decoder to selectively couple the selected sense line (BL) 274 to a volt-meter based on a determination that the selected sense line is an odd-numbered sense line or an even-numbered sense line, respectively.

Thus, by measuring the voltage difference (Vmeas) between the selected access line and the selected sense line (e.g., in response to the selection voltage(s) (e.g., Vsel) being applied to the selected cell for a memory operation), and dynamically adjusting the selection voltage(s) (e.g., Vsel), such an IR-compensation scheme can enable consistently providing an adjusted (which could be a readjusted) voltage sufficient to execute or complete execution of the memory operation. This can provide improved memory performance and eliminate or reduce the Vmeas dependency on the background data patterns, as occurs in the conventional static IR compensation schemes. Many structural variations are possible.

Figure 3A:
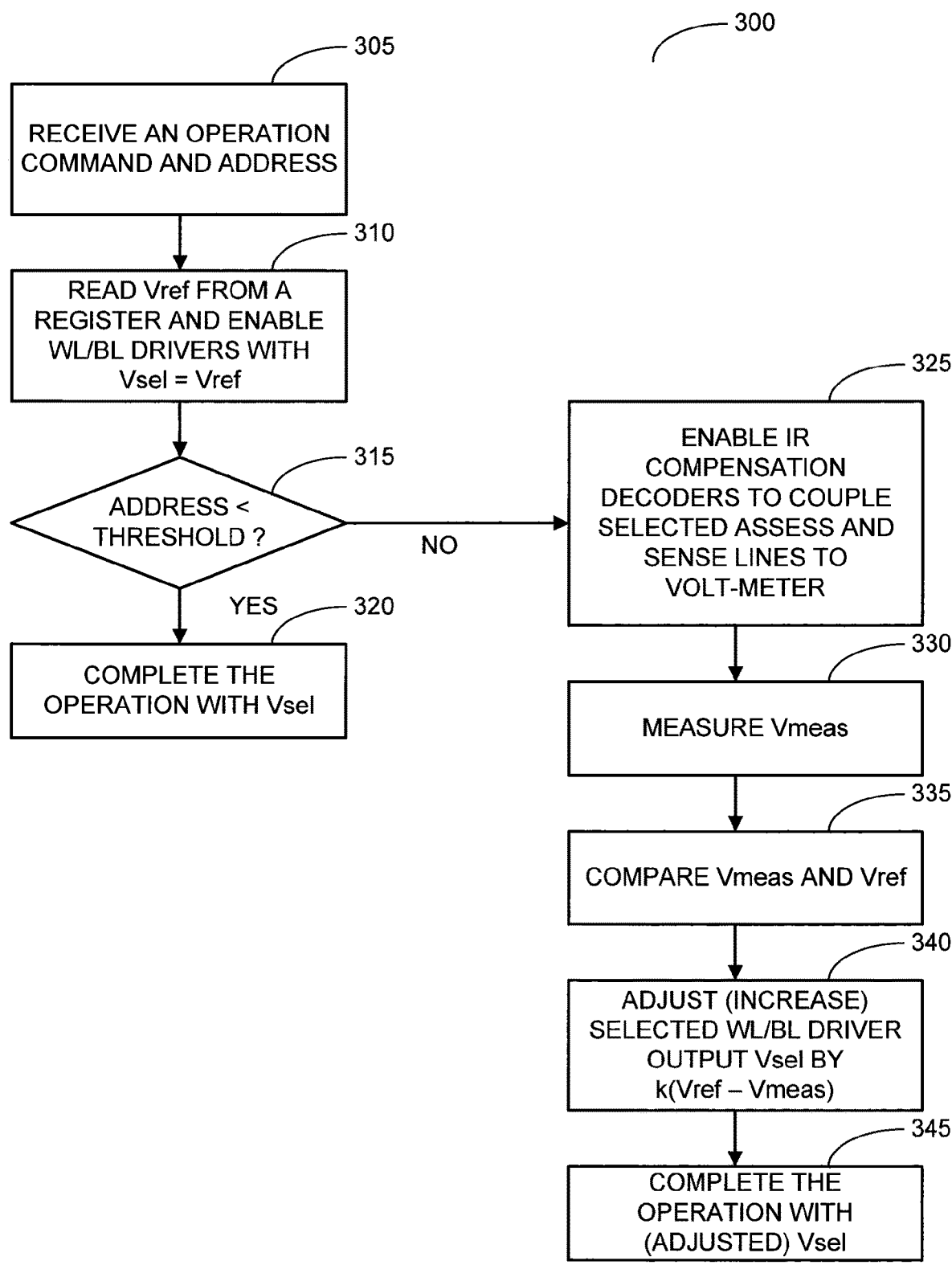
FIGS. 3A and 3B show flow diagrams illustrating several methods to compensate for a parasitic voltage (IR) drop in the memory array of the memory device of FIG. 2, according to various embodiments of the invention.

FIG. 3A is a flow diagram illustrating several methods 300 for a single-pulse operation, such as a memory operation 400, according to various embodiments of the invention. The methods may be implemented using the apparatuses shown in FIGS. 1-2, among others. In various embodiments, the methods 300 may commence at block 305 with receiving a command to execute a memory operation (e.g., set, reset or read) and its associated address from an external process, such as the one or more processors 260.

At block 310, a reference voltage (e.g., Vref) for a relevant memory operation to be executed according to the received command may be read from a relevant register, such as the register 212, and relevant WL/BL drivers, such as the row/column drivers 220, may be enabled with a selection voltage(s) (e.g., Vsel) set to be at least substantially equal to the Vref. In one embodiment, the Vref may be specified for each memory operation and pre-stored in the register.

At block 315, the address associated with the command may be checked to determine whether a selected cell indicated by the address is within a specified threshold.

At block 320, the methods 300 may comprise completing the memory operation with the (unadjusted) Vsel if it is determined that the address is within the threshold. That is, the methods 300 may refrain from implementing IR compensation, for example based on determining that the selected cell is located in a specified area of the memory array, such as the non-shaded area of the memory array 270 of FIG. 2. In one embodiment, the determination may comprise determining that the selected cell is located in any direction closer to a corresponding driver supplying the selection voltage(s) than a threshold distance. For example, the threshold distance may be configured to be about one-quarter (¼), one-third (⅓), one-half (½) or any specified portion of the length of the access lines or sense lines as measured from an associated driver, such as the row/column drivers 220 of FIG. 2.

Many variations are possible for refraining from implementing the IR compensation. In various embodiments, when the selected cell for a given memory operation falls into the specified area, the methods 300 may skip at least one of measuring a voltage difference between the selected access line and the selected sense line, comparing the measured voltage difference with a relevant reference voltage or adjusting a selection voltage(s) to be applied to the selected cell responsive to the comparison. Accordingly, in one embodiment, the selection voltage(s) (e.g., Vsel) for the selected cell may not be adjusted, despite the existence of a voltage difference between a selected access line and selected sense line associated with the selected cell. In one embodiment, the control circuit 210 may return an error message (e.g., "selection voltage error") to an external processor that issued the command, such as the one or more processors 260.

Figure 4A:
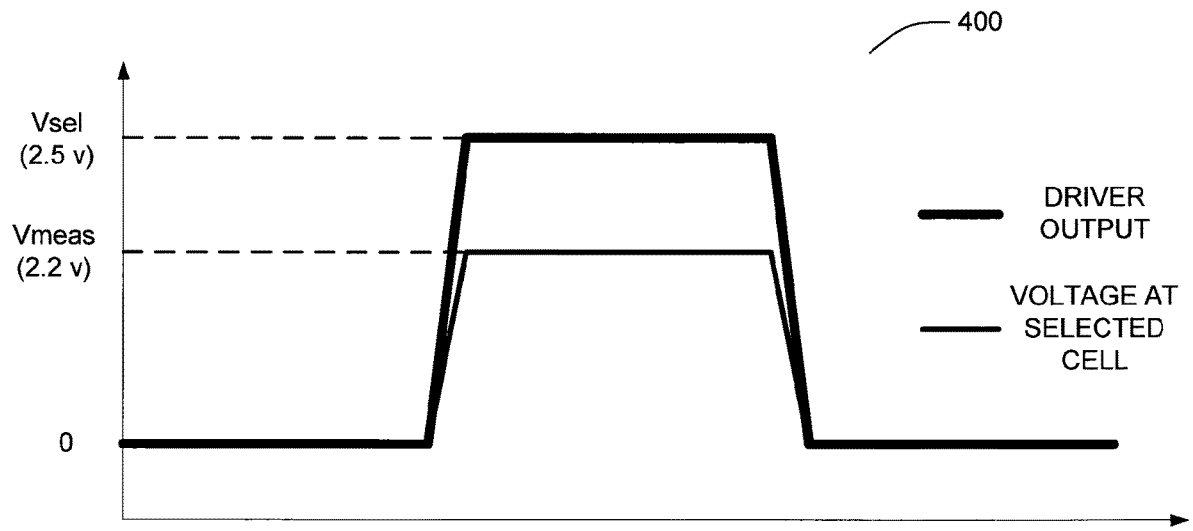
FIGS. 4A-4D show signal diagrams for a single-pulse or multi-pulse operation of the memory device in FIG. 2, according to various embodiments of the invention.

For example, referring now to FIG. 4A, the signal diagram for the driver output voltage, such as the selection voltage(s) (e.g., Vsel), and the voltage difference between the selected access line and the selected sense line (e.g., Vmeas) for the memory operation 400 for which the $V_{SEL}$ is not adjusted is illustrated at FIG. 4A according to various embodiments. It is noted that although illustrated only with respect to a single-pulse operation, refraining from implementing IR compensation may be enforced for multi-pulse memory operations, such as the memory operation 450, as will be described below.

Referring back to FIG. 3A, in various embodiments, at block 325, if it is determined that the address associated with the memory operation is not within the threshold, the methods 300 may further comprise enabling IR compensation decoders, such as the IR compensation row 240 and/or the IR compensation column decoders 235, to couple selected access and sense lines associated with the selected cell to a relevant volt-meter, such as the volte-meter 255.

At block 330, the Vmeas may be measured between the selected access line and the selected sense line associated with the selected cell using the volt-meter. At block 335, the Vmeas may be compared with the Vref, such as to compute a voltage drop along the selected access line and the selected sense line, difference between the Vref and the Vmeas (i.e., Vref-Vmeas). At block, 340, the Vsel may be adjusted responsive to the comparison, such as to dynamically compensate the computed voltage drop. For example, in one embodiment, the Vsel may be increased by the amount of (Vref-Vmeas) multiplied by k, where k is a constant equal to or larger than one (1). Then, at block 345, the adjusted Vsel may then be applied to the selected cell to execute or to complete execution of the memory operation.

Figure 4B:
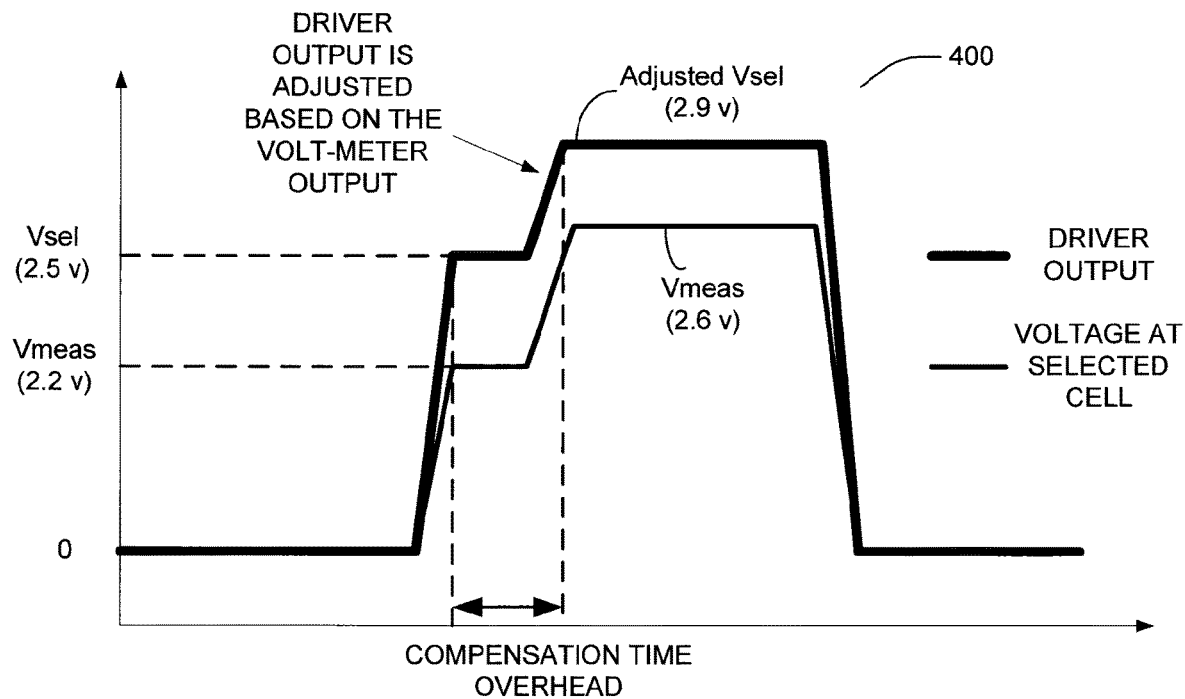

For example, referring now to FIG. 4B, in various embodiments, it may take about one microsecond to execute the memory operation 400, such as a read operation, including compensation. In this scenario, at the beginning of the pulse there may be a "compensation time overhead" of about 100 nanoseconds. During the compensation time overhead, the methods 300 may apply an initial selection voltage(s) (e.g., Vsel) (e.g., about 2.5 v) to selected lines, such as the selected access line 272 and/or the selected sense line 274 associated with the selected cell 276, measure the voltage difference between the selected lines (e.g., Vmeas) (e.g., about 2.2 v), such as in response to the initial selection voltage(s) (e.g., Vsel) being applied to the selected cell, compare the measured voltage (e.g., Vmeas) with a reference voltage (e.g., Vref) (e.g., about 2.6 v) for the read operation read from the relevant register 212, and adjust the selection voltage(s) (e.g., to about 2.9 v) responsive to the comparison. Then, the memory operation 400 may complete execution during the remaining portion (e.g., about 900 nanoseconds) of the read pulse.

In still various embodiments, a voltage difference between a selected access line and a selected sense line associated with a selected cell of a plurality of memory cells of a memory array may be measured. The measured voltage difference may be compared with a reference voltage specified for a memory operation. A selection voltage(s) applied to the selected cell for the memory operation may be adjusted to provide an adjusted selection voltage(s) responsive to the comparison.

In one embodiment, the measuring may comprise coupling the selected cell to a volt-meter configured to measure the voltage difference between the selected access lines and the selected sense lines. In one embodiment, the coupling may comprise coupling the selected access line and the selected sense line to the volt-meter via a compensation row decoder and a compensation column decoder, respectively. In one embodiment, the comparing may comprise reading a value of the reference voltage from a register. In one embodiment, the adjusting may comprise increasing the selection voltage(s), such as by at least the difference between the reference voltage and the measured voltage difference. In one embodiment, the memory operation may comprise at least one of a set operation, a reset operation, or a read operation. In one embodiment, the methods 300 may further comprise refraining from at least one of the measuring, comparing and adjusting acts in response to the selected cell being located in a specified area of the memory array. In one embodiment, the methods 300 may further comprise determining whether the selected cell is located closer to a corresponding driver supplying the selection voltage(s) than a threshold distance. In one embodiment, the methods 300 may further comprise activating a sense amplifier to complete the memory operation responsive to determining that the measured voltage difference is at least substantially equal to the reference voltage.

Figure 3B:
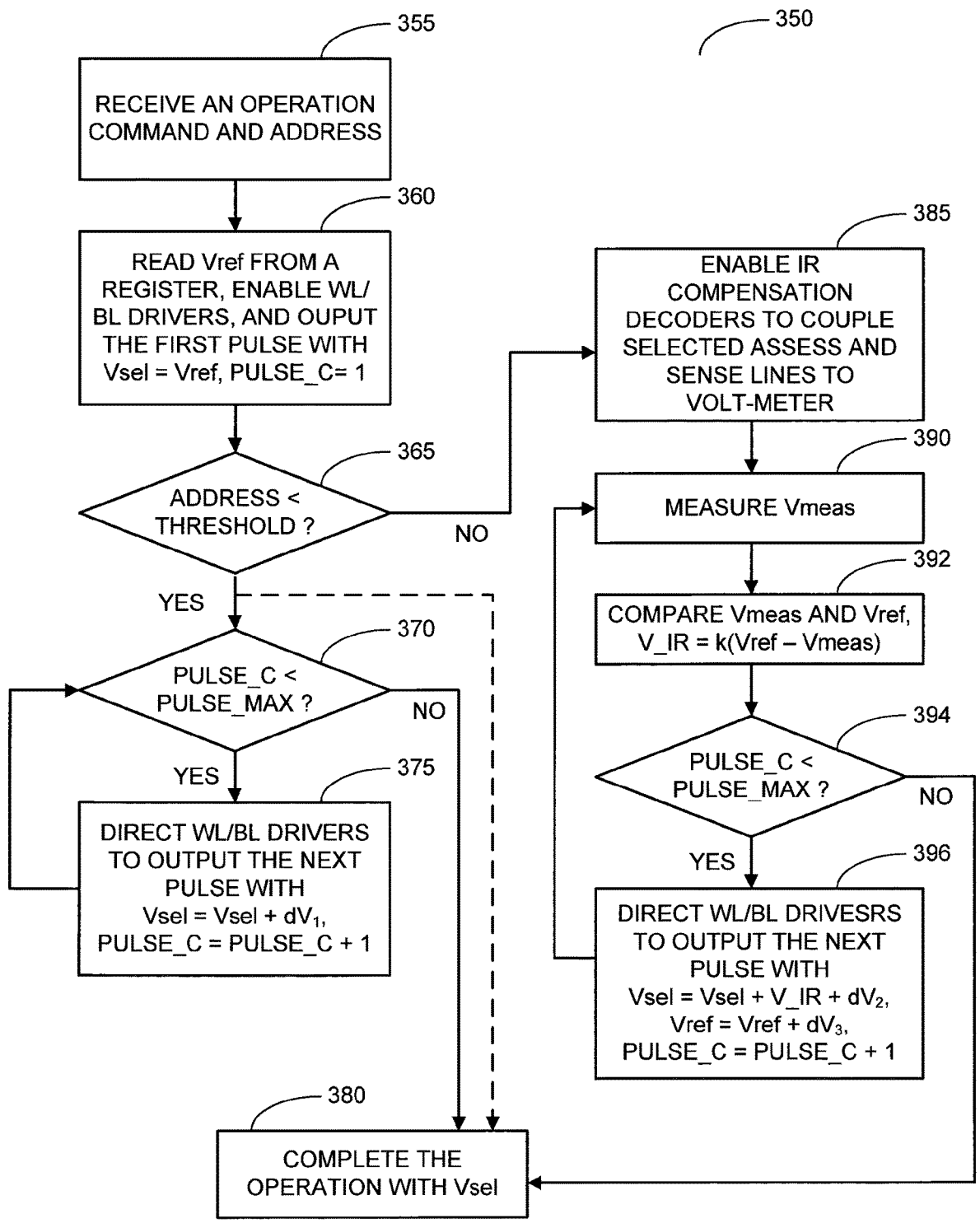

FIG. 3B is a flow diagram illustrating several methods 350 for a multi-pulse operation, such as a memory operation 450, according to various embodiments of the invention. The methods 350 may be implemented using the apparatuses shown in FIGS. 1-2, among others. In various embodiments, the methods 350 may commence at block 355 with receiving a command to execute a relevant memory operation (e.g., set, reset or read) and its associated address from an external process, such as the one or more processors 260.

At block 360, a reference voltage (e.g., Vref) for the received operation command may be read from a relevant register, such as the register 212, and relevant WL/BL drivers, such as the row/column drivers 220, may be enabled with a selection voltage(s) (e.g., Vsel) set to be at least substantially equal to the $V_{ref}$. Also, a current pulse (PULSE_C) may be set to one (1). In one embodiment, the Vref may be specified for each memory operation and pre-stored in the register.

At block 365, the address associated with the memory operation may be checked to determine whether a selected cell indicated by the address is within a specified threshold. In one embodiment, as noted with respect to FIG. 3A, the determination may comprise determining that the selected cell is located in any direction closer to a corresponding driver supplying the selection voltage(s) than a threshold distance. For example, the threshold distance may be configured to be about one-quarter (¼), one-third (⅓), one-half (½) or any specified portion of the length of the access lines or sense lines as measured from an associated driver, such as the row/column drivers 220 of FIG. 2.

At block 370, if it is determined that the address is within the threshold, then the methods 350 may further check whether the current pulse for the operation is the last of a number of pulses (PULSE-MAX) specified for the memory operation by comparing the PULSE_C with the PULSE_MAX.

At block 375, if it is determined that the current pulse is not the last of the number of pulses (e.g., PULSE_C is less than PULSE_MAX), then the methods 350 may further comprise directing the WL/BL drivers to output the next pulse with an adjusted Vsel and increase the PULSE_C by one (1). The Vsel may be increased by a first specified amount of voltage (e.g., $dV_1$). In one embodiment, the $dV_1$ may be a constant value or a gradually increasing value.

Figure 4C:
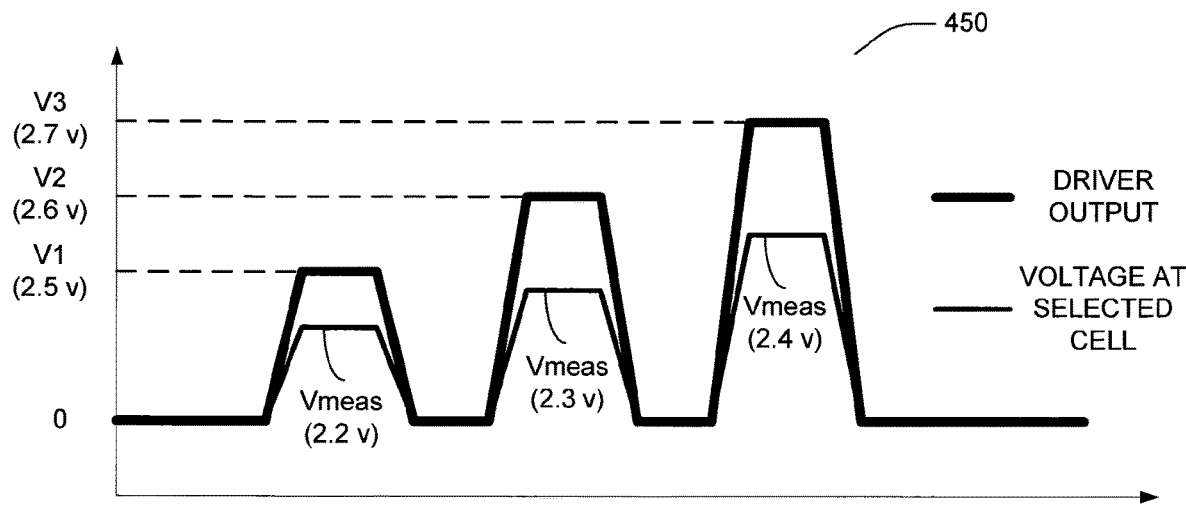
Figure 4D:
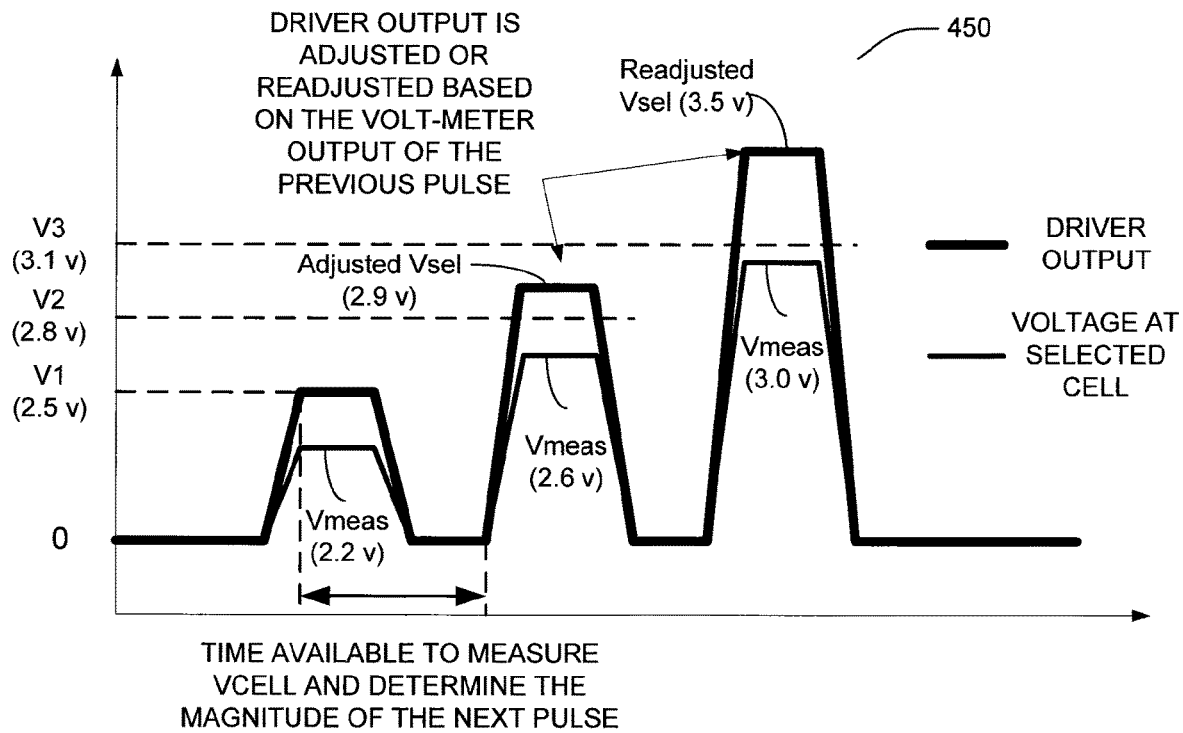

For example, referring now to FIG. 4C, in various embodiments, one or more of the memory operations, such as a set operation, may be performed via more than one pulse (e.g., pulses 450 shown in FIGS. 4C and 4D). In one embodiment, if the selected cell for the memory operation falls into the specified area, then the selection voltage(s) provided by the associated driver, such as the row/column driver 220 of FIG. 2, for the selected cell may be gradually increased during subsequent pulses, for example, from about 2.5 volts to about 2.6 volts and then to about 2.7 volts. That is, the methods 350 may skip at least one of measuring the voltage difference between the selected lines (e.g., the selected access line and the selected sense line) associated with the selected cell, comparing the measured voltage difference with a reference voltage specified for the memory operation, or dynamically adjusting the selection voltage(s) responsive to the measurement and/or comparison. For example, in one embodiment, the selection voltage(s) for the memory operation 450 may be automatically increased gradually via multiple pulses until it reaches a voltage that is at least substantially equal to a reference voltage for a requested memory operation.

It is noted that the selection voltage(s) may be gradually increased by other constant variation amounts, such as about 0.2 or 0.3 volts, instead of about 0.1 volt. It is noted that the selection voltage(s) may be increased 0.1 volt at the first occurrence, 0.2 volts at the second occurrence, and 0.3 volts at the third occurrence, and so on. It is also noted that the gradual increment of the selection voltage(s) without dynamic adjustment may be applied to not only a multi-pulse operation, such as the memory operation 450, but also a single-pulse operation, such as the memory operation 400.

Referring back to FIG. 3B, the methods 350 may repeat the steps 370 and 375 until the last of the number of pulses is reached. At block 370, if it is determined that the current pulse is the last of the number of pulses for the memory operation, the methods 350 may execute or complete execution of the memory operation using the adjusted Vsel at block 380.

In one embodiment, if it is determined that the address associated with the operation command is within the threshold, at block 365, then the methods 350 may simply complete the operation with the unadjusted Vsel at block 380 without going through the steps 370 and 375 (shown by the dotted line). That is, the methods 350 may refrain from performing IR compensation or adjusting the Vsel based on determining that the selected cell is located in the specified area of the memory array, such as the non-shaded area of the memory array 270 of FIG. 2.

In various embodiments, at block 385, if it is determined that the address is not within the threshold, the methods 350 may further comprise enabling IR compensation decoders, such as the IR compensation row decoder(s) 240 and/or IR compensation column decoder(s) 235, to couple selected access and sense lines associated with the selected cell to a relevant volt-meter, such as the volte-meter 255.

At block 390, the Vmeas may be measured between the selected lines, such as using the volt-meter. At block 392, the Vmeas may be compared with a reference voltage specified for the memory operation (e.g., Vref), such as to compute a voltage drop (e.g., V_IR) along the selected access line and the selected sense line, a difference between the Vref and the Vmeas (i.e., Vref-Vmeas). At block 394, the methods may further comprise checking whether the current pulse for the operation is the last of the number of pulses (PULSE-MAX) specified for the operation by comparing the PULSE_C with the PULSE_MAX.

At block 396, if it is determined that the current pulse for the operation is not the last of the number of pulses (e.g., PULSE_C<PULSE_MAX), then the methods 350 may further comprise directing the WL/BL drivers to increase the selection voltage(s) (e.g., Vsel) for the next pulse by the V_IR multiplied by k, where k is a constant equal to or larger than one (1), and/or a second specified amount of voltage, $dV_2$. Also, in one embodiment, the methods 350 may increase the Vref by a third specified amount of voltage, $dV_3$, and increase the PULSE-C by one (1). In one embodiment, all of the $dV_1$, $dV_2$ and $dV_3$ may be the same number, or at least one of them may be a different number from others.

In one embodiment, the methods 350 may comprise receiving the plurality of pulses including a first pulse and a second pulse for the memory operation. In such a scenario, the voltage drop may be measured during the first pulse and the selection voltage(s) may be adjusted during the second pulse. In another embodiment, the methods 350 may comprise receiving a third pulse for the memory operation. In such a scenario, the selection voltage(s) adjusted during the second pulse may be readjusted during the third pulse.

For example, referring now to FIG. 4D, in various embodiments, in response to the initial selection voltage(s) V1 (e.g., about 2.5 volts) being applied, the voltage difference (e.g., Vmeas) between relevant selected lines (e.g., the selected access line and the selected sense line) may be measured be about 2.2 volts during the first pulse. After a compensation time overhead (as indicated by the arrow in FIG. 4B), the selection voltage(s) V1 may be increased to provide an adjusted selection voltage(s) (e.g., Vadj) (e.g., to about 2.9 volts) during the second pulse. The adjusted selection voltage(s) may result in the Vmeas for the second pulse being set to a new value (e.g., about 2.6 volts). Then, based on the Vmeas measured during the second pulse (e.g., about 2.6 volts), the adjusted selection voltage(s) (e.g., Vadj)

may be increased again to produce a readjusted selection voltage(s) (e.g., Vradj) (e.g., about 3.5 v) during the third pulse. This readjusted selection voltage(s) (e.g., Vradj) may result in the Vmeas for the third pulse being set to another new value (e.g., to about 3.0 volts). That is, compared to an approximate 0.4 volts increase during the second pulse compared to the first pulse, the selection voltage(s) may be increased by about 0.6 volts during the third pulse compared to the second pulse. Such a use of weighted increments in the selection voltage(s) may be useful, such as when the IR drop increases as the selection voltage(s) increases, for example, by virtue of a data pattern change in associated memory cells.

It is noted that although the adjustment of the selection voltage(s) is explained with respect to the first, second, and third pulse for simplicity, more than three pulses may be involved in the IR compensation scheme depending on the type of memory operations. Accordingly, the selection voltage(s) may be adjusted more than twice, continuously or non-continuously. It is also noted that regardless of the number of pulses used for the memory operations to be executed, the selection voltage(s) may be adjusted by increasing, such as by at least the difference between the Vref and the Vmeas. For example, the selection voltage(s) may be increased by about 0.3 volts or 0.4 volts in the case of the difference between the Vsel and Vmeas being about 0.3 volts (i.e., about 2.5 volts minus 2.2 volts), as illustrated in FIG. 4D.

Referring back to FIG. 3B, the methods 350 may repeat the steps 390, 392, 394 and 396 until the last of the number of pulses is reached. Then, at block 394, if it is determined that the current pulse is the last pulse of the number of pulses for the memory operation, the methods 350 may execute or complete execution of the memory operation using the selection voltage(s) (e.g., Vadj or Vradj) adjusted according to the outcome of the dynamic IR measurement and comparison, at block 380.

In still various embodiments, a voltage difference between a selected access line and a selected sense line associated with a selected cell of a plurality of memory cells of a memory array may be measured during a first pulse of a memory operation directed to the selected cell. The measured voltage difference may be compared with a reference voltage specified for the memory operation, such as during the first pulse or a second pulse of the memory operation. A selection voltage(s) applied to the selected cell for the memory operation may then be adjusted during the second pulse to provide an adjusted selection voltage(s) responsive to the comparison.

In one embodiment, the adjusted selection voltage(s) may be readjusted during a third pulse of the memory operation. In yet another embodiment, the reference voltage may be adjusted for the second pulse.

All or some of the activities described herein may be performed using one or more control circuits, such as the control circuit 210 in FIG. 2. Also, although only some activities are described with respect to FIGS. 3A and 3B, the methods 300, 350 may perform other activities, such as operations performed by other components in the memory device 205, such the address circuitry 215, the row/column driver 220, the row decoder 225, the column decoder 230, the compensation column decoder 235, the IR compensation row decoder 240, the sense amplifier 245 and/or the I/O interface 250 of FIG. 2, in addition to and/or in alternative to the activities described with respect to FIGS. 3A and 3B.

Any of the components previously described may be implemented in a number of ways, including embodiments in software. Software embodiments may be used, for example, in a simulation device, and the output of such a device may be used to operate various portions of the system 200 of FIG. 2 described herein.

Thus, one or more of the following components described herein may be implemented as a corresponding "module": the memory device 205, the control circuit 210, the register 212, the address circuitry 215, the row/column driver 220, the row decoder 225, the column decoder 230, the IR-compensation column decoder 235, the IR-compensation row decoder 240, the sense amplifier 245, the I/O interface 250, the one or more processors 260, the memory array 270, the access line including the selected access line 272, the sense lines including the selected sense line 274, the memory cells including the selected cell 276, connecting lines between the components (e.g., connectors 278), the selection voltage(s) (e.g., Vsel) provided by an associated driver for the selected cell, and the voltage difference (e.g., Vmeas) measured between the selected access line 272 and the selected sense line 274.

The modules may include hardware circuitry, optical components, single or multi-processor circuits, memory circuits, software program modules and objects, firmware, alone and in combinations thereof, as desired by the architect of the system 200 and the memory device 205 of FIG. 2, and as appropriate for particular implementations of various embodiments. Accordingly, for example, a "control module" can comprise control circuitry, such as the control circuit 110 and/or the control circuit 210, alone or in combination with firmware, for example.

The apparatuses and methods of various embodiments may be useful for IR compensation in not only a RRAM memory array but also other memory arrays, such as random access memory (RAM) memory arrays, and thus, the various embodiments are not to be so limited. The illustrations of the system 200, device 205 and methods 300, 500 are intended to provide a general understanding of the structures and functionalities of various embodiments, and not as a complete description of all the elements and features of apparatuses or methods that might make use of the structures and functionalities described herein.

The novel apparatuses and methods of various embodiments may comprise and/or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatuses and methods may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

It is noted that the methods described herein do not have to be executed in the order described, or in any particular order. Moreover, various activities described with respect to the methods identified herein can be executed in repetitive, serial, heuristic, or parallel fashion. The individual activities of the methods 300, 350, 500 illustrated at FIGS. 3A, 3B and 5, respectively, can also be combined with each other and/or substituted, one for another, in various ways.

Information, including memory operations, commands, parameters, operands, and other data, can be sent and received in the form of one or more carrier waves. Thus, many other embodiments may be realized.

A software program may be launched from a computer-readable storage medium in a computer-based system to execute one or more functions described herein. Various programming languages may be employed to create software programs designed to implement and perform the methods disclosed herein. The programs may be structured in an object-oriented format using an object-oriented language such as Java or C++. Alternatively, the programs may be structured in a procedure-oriented format using a procedural language, such as assembly or C. The software components may communicate using a number of mechanisms well known to those of ordinary skill in the art, such as application program interfaces or inter-process communication techniques, including remote procedure calls. The teachings of various embodiments are not limited to any particular programming language or environment. Thus, other embodiments may be realized.

For example, an apparatus, such as a computer, a memory system, a magnetic or optical disk, some other storage device, and/or any type of electronic device or system may include a processor coupled to a machine-accessible medium such as a memory (including the memory array 270 of FIG. 2) having associated information (e.g., computer program instructions and/or data), which, when accessed, results in an apparatus e.g., the one or more processors 260 of FIG. 2) performing any of the activities described herein with respect to the methods 300, 350 illustrated at FIGS. 3A and 3B.

The apparatuses and methods disclosed herein may operate to compensate for a voltage (IR) drop that occurs during execution of any type of a memory operation in a memory array, including a RRAM array. Increased device reliability, and enhanced operational accuracy, may result.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. § 1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus, comprising:
   a memory array including multiple memory cells; and
   a compensator to implement compensation of a selection voltage applied to a selected cell of the multiple memory cells, the compensator being operable to measure a voltage difference between a selected access line and a selected sense line associated with the selected cell;
   wherein the compensator is to refrain from implementing the compensation responsive to the selected cell being located in a second region of the memory array based on a pre-determined threshold distance from a respective row driver or a respective column driver.

2. The apparatus of claim 1, wherein the compensator is configured to determine that the selected cell is located in a specified area of the memory array based on a determination that the selected cell is closer to a corresponding driver supplying the selection voltage than a threshold distance.

3. The apparatus of claim 1, wherein the compensator comprises:
   a volt-meter;
   a control module; and
   multiple compensation row decoders including a first compensation row decoder and a second compensation row decoder, the control module being configured to use the first compensation row decoder or the second compensation row decoder selectively to couple the selected access line to the volt-meter responsive to whether the selected access line is an odd-numbered access line or an even-numbered access line, respectively.

4. The apparatus of claim 3, wherein the compensator further comprises:
   multiple compensation column decoders including a first compensation column decoder and a second compensation column decoder, the control module being configured to use the first compensation column decoder or the second compensation column decoder to selectively couple the selected sense line to the volt-meter responsive to whether the selected sense line is an odd-numbered sense line or an even-numbered sense line, respectively.

5. The apparatus of claim 1, wherein the compensator comprises a volt-meter to measure the voltage difference between the selected access line and the selected sense line.

6. The apparatus of claim 3, wherein the volt-meter is configured to provide an impedance of at least two orders of magnitude higher than a collective impedance of the access lines and the sense lines.

7. The apparatus of claim 1, wherein the multiple memory cells comprise one or more tunable resistive materials.

8. The apparatus of claim 1, wherein the second region is indicative that the selected cell is located more distant from the respective row decoders or the respective column decoders than the multiple memory cells in the first region of the memory array.

9. An apparatus, comprising:

a memory array including multiple memory cells; and a compensator configured to implement compensation with a selection voltage applied to a selected cell of multiple memory cells in a first region of the memory array, the compensator being configured to measure a voltage difference between a selected access line and a selected sense line associated with the selected cell for each memory operation, the measured voltage difference to include a voltage drop at a location the selected cell due to a parasitic voltage drop for each of the selected access line and the selected sense lines at a respective cross-point associated with the selected cell; and wherein the compensator is further configured to refrain from implementing the compensation responsive to a selected cell being located in a second region of the memory array.

10. The apparatus of claim 9, wherein the measured voltage difference is further to include a measured parasitic voltage drop on the selected cell caused by leakage currents from background effects of unselected ones of the multiple memory cells proximate to the selected cell.

11. The apparatus of claim 9, wherein the compensator further comprises a first compensation column decoder and a second compensation column decoder coupled to opposite ends of sense lines of the memory array.

12. The apparatus of claim 9, wherein the compensator further comprises a first compensation row decoder and a second compensation row decoder coupled to opposite ends of access lines of the memory array.

* * * * *